United States Patent [19]
Chen

[11] Patent Number: 5,226,723
[45] Date of Patent: Jul. 13, 1993

[54] LIGHT EMITTING DIODE DISPLAY

[76] Inventor: Der-Jong Chen, 3F, No. 7, Lane 118, An Chu Street, Taipei, Taiwan

[21] Appl. No.: 881,209

[22] Filed: May 11, 1992

[51] Int. Cl.$^5$ .............................................. F21V 7/00
[52] U.S. Cl. .................................... 362/241; 362/237; 362/247; 362/800; 313/501
[58] Field of Search ............... 362/235, 236, 237, 241, 362/247, 249, 310, 350, 800; 313/501, 512

[56] References Cited

U.S. PATENT DOCUMENTS

| | | | |
|---|---|---|---|
| 3,875,456 | 4/1975 | Kano et al. | 313/501 |
| 4,013,915 | 3/1977 | Dufft | 313/512 |
| 4,254,453 | 3/1981 | Mouyard et al. | 362/241 |
| 4,742,432 | 5/1988 | Thillays et al. | 362/800 |
| 4,935,665 | 6/1990 | Murata | 362/800 |
| 5,001,609 | 3/1991 | Gardner et al. | 362/800 |
| 5,119,174 | 6/1992 | Chen | 362/800 |

Primary Examiner—Ira S. Lazarus
Assistant Examiner—Y. Quach
Attorney, Agent, or Firm—Bacon & Thomas

[57] ABSTRACT

An improved light emitting diode display includes a printed circuit board, a reflector and one or more LED chips. The printed circuit board serves as a base to fix the LED chips and the reflector has an appropriate thickness, contains one or more bowl-like reflective surfaces each with a corresponding passing hole located at such position as close to the bowl-like reflective surface as possible. The bowl-like reflective surface are just big enough to hold one LED chip, with the LED electrode connecting wire extending out of the bowl-like reflective surface and passing through the passing hole to be fixed to the printed circuit board. The small size of the reflective surface permits increased convergency and intensity of the reflective light emitted by the LED chips.

4 Claims, 3 Drawing Sheets

LIGHT EMITTING DIODE DISPLAY

BACKGROUND OF THE INVENTION

The present invention relates to a light emitting diode (LED) display, particularly an improved frame for light emitting diode display.

Conventionally, LED displays are substantially classified into two types according to the frames used for LED chips—Lead Frame and P.C.B. (printed circuit board) Frame. The former is rarely used because of its high assembly cost and it is difficult to obtain a satisfactory matching on LED's intensity and color. The latter is widely used because its cost is low, its production is easy, and it is easy to match intensity and color.

As shown in FIG. 4, the LED display with a printed circuit board (10) as a base uses a reflector (11) to reflect upward and converge light emitted from every LED chip (12) to increase intensity. However, as one of the characteristics of the LED chip, a part of the light emitted (A) is emitting upward, while the other part of the light emitted (B) is emitted to the surroundings, as shown in FIG. 5. Upon reflection of the light emitted to the surroundings at the reflective surface (14) on the reflector (11), the intensity (i) of the upward reflected light is inversely proportional to the square of the distance (d2) between the reflective surface (14) and the LED chip (12). Then, if $d1 < d2$, $i1 > i2$. In other words, the smaller the distance between the reflective surface (14) and the LED chip (12), the greater the intensity of the reflected light. However, the conventional reflector (11) has to surround the LED chip (12) and the wire bonding position (13) so that a considerable large distance between the LED chip (12) and the reflective surface (14) is required. Then, it is hard to converge the light reflected from the reflective surface (14), there is a loss on intensity, and the conventional LED display is not satisfactory.

SUMMARY OF THE INVENTION

In view of the above defects, the inventor has successfully created a light emitting diode display which can provide an outstanding convergency effect and high intensity. It use a small bowl-like reflective surface which is just big enough to surround a LED chip with electrode connecting wire fixed outside the bowl-like reflective surface in order to minimize the distance between the LED chip and the reflective surface for the best convergency and the highest intensity. With such an arrangement, the intensity of the upward reflected light is approximately the same as the intensity of light emitted from the LED chip, and the loss in intensity is very small. Moreover, by incorporation with a lens, a good control on the light can be achieved. Therefore, the present invention provides a very ideal LED display.

BRIEF DESCRIPTION OF THE DRAWINGS

These and other objects and features of the invention will become more apparent from the following description taken in connection with the accompanying drawings wherein.

DETAILED DESCRIPTION OF THE PREFERRED EMBODIMENT

Figure 4:
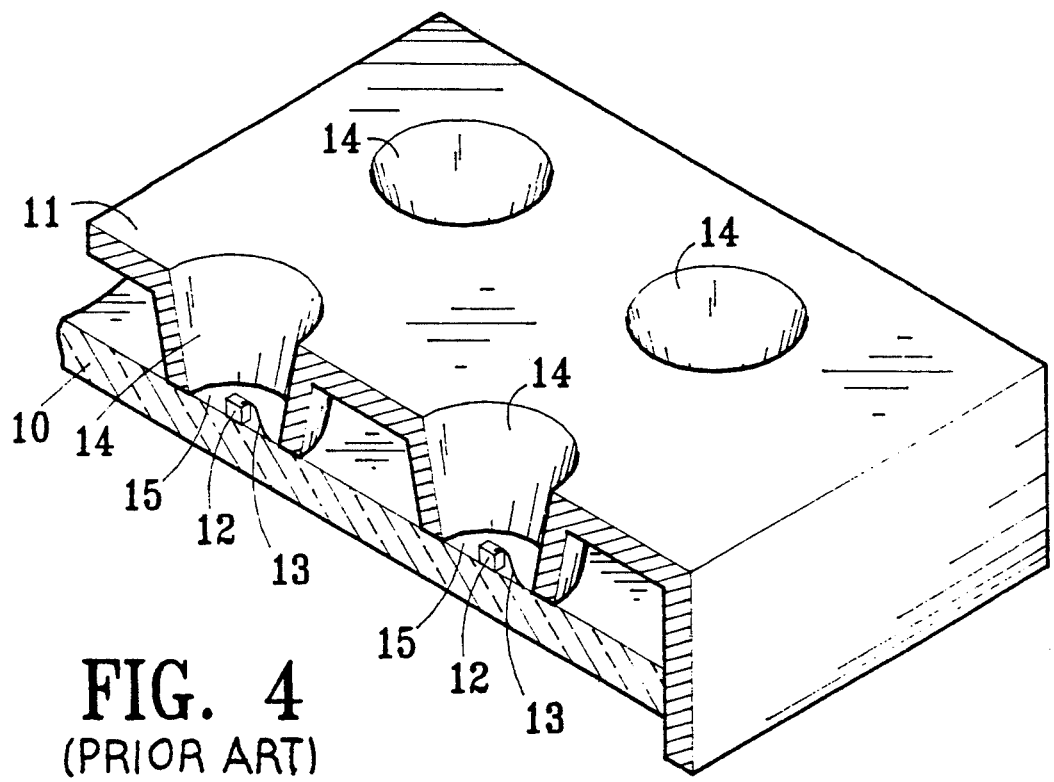
FIG. 4 is a perspective view of the conventional LED display with partial cutout.
Figure 1:
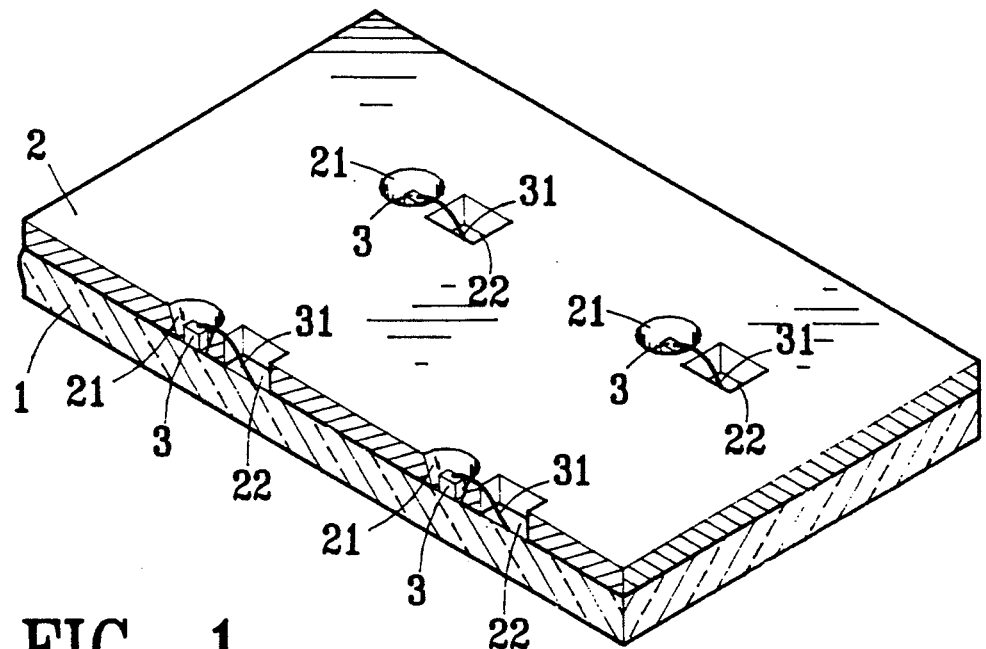
FIG. 1 is a perspective view of the improved LED display according to the present invention with partial cutout.
Figure 5:
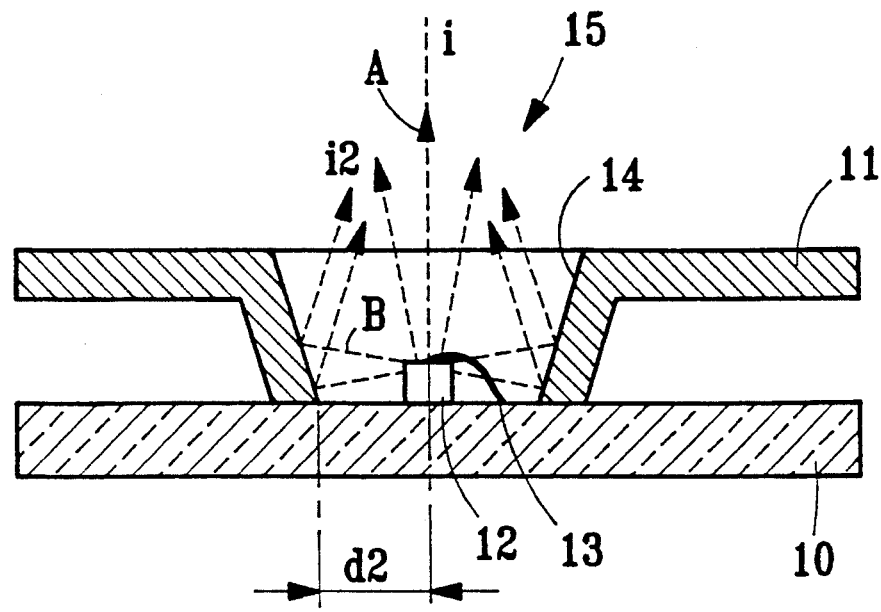
FIG. 5 illustrates convergence of reflective lights from the conventional LED display.
Figure 2:
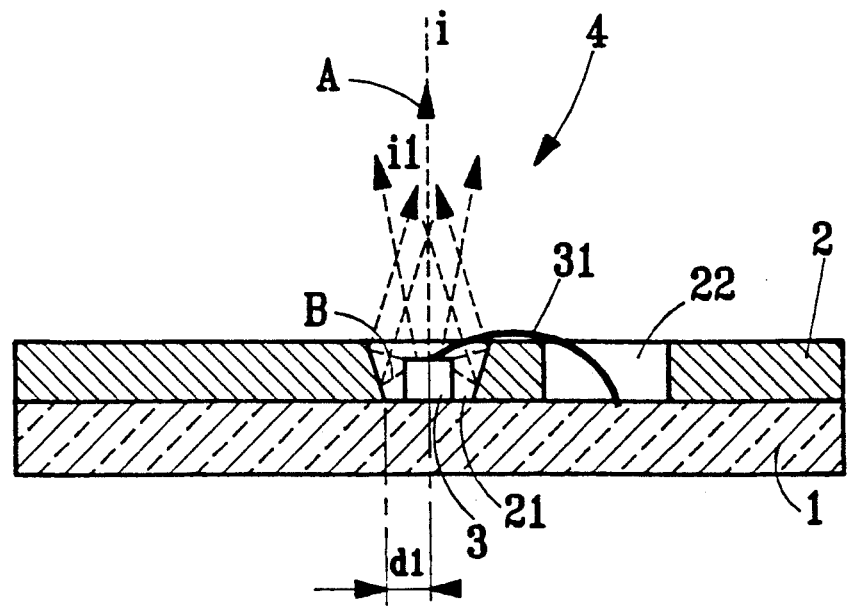
FIG. 2 illustrates convergence of reflective lights from the LED display according to the present invention.

Referring to FIG. 1, a perspective view of the improved LED display according to the present invention with partial cutout, the LED display comprises a printed circuit board (1), a reflector (2) and a plurality of LED chips (3). The printed circuit board (1) serves as a frame to fix the LED chips (3). The LED chips (3) are fixed to the printed circuit board (1) and then the reflector (2) is put in place. The reflector (2) has at least more than one bowl-shaped reflective surface (21) each with a corresponding passing hole (22) located at a place as close to the bowl-shaped reflective surface (21) as possible. Each bowl-shaped reflective surface (21) is aligned with an LED chip (3) having an electrode connecting wire (31) which passes through the corresponding passing hole (22) and then connected to the printed circuit board (1). The reflector (2) has an appropriate thickness, and the bowl-shaped reflective surface (21) has a size just large enough to surround the area where each LED chip (3) is fixed and permit an electrode connecting wire (31) to be fixed outside the bowl-shaped reflective surface (21). Therefore, the shorter than distance d1 between the reflective surface (21) and the LED chip (3), the higher the convergence and intensity of lights (4) emitted from the LED chip (3) as shown in FIG. 2.

Figure 3:
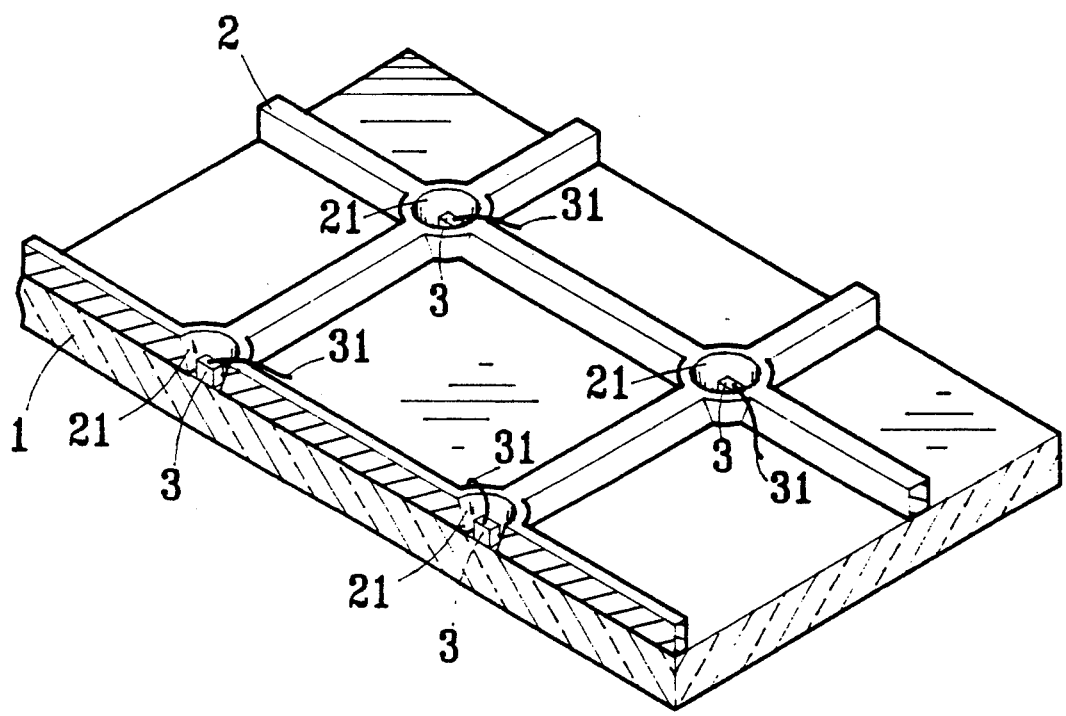
FIG. 3 illustrates another reflector for the LED display according to the present invention.

Please refer to FIG. 3 for another embodiment of the reflector for the LED display. A matrix reflective surface is formed by the bowl-shaped reflective surfaces (21) of the reflector (2), with electrode connecting wire (31) from each LED chip (3) fixed to any location on a printed circuit board (1) outside the bowl-shaped reflective surface (21). The bowl-like reflective surface (21) is in the form, substantially, of a bowl LED chip (3).

As described above, the present invention refers to a light emitting diode display which provides an outstanding convergency effect and intensity by using of a small bowl-like reflective surface having a size just enough to surround each LED chip fixed thereto, and permitting fixing of an electrode connecting wire outside the bowl-like reflective surface in order to minimize the distance between the reflective surface and the LED chip. Therefore, the reflected light has an outstanding convergency effect and intensity, the intensity of all the light reflected outwards is approximately the sum of the intensity of all the light emitted from the LED chip and, the loss in intensity is very small. Moreover, by incorporation with a lens, a good control on the light can be achieved. Therefore, the present invention provides a very ideal LED display.

Many changes and modifications in the above described embodiment of the invention can, of course, be carried out without departing from the scope thereof. According, to promote the progress in science and the useful arts, the invention is disclosed and is intended to be limited only by the scope of the appended claims.

What is claimed is:

1. An improved light emitting diode display, comprising:
   a printed circuit board;
   an LED chip fixed on the printed circuit board;
   a reflector fixed on the printed circuit board;
   a bowl-shaped reflective surface in the reflector which surrounds the LED chip fixed to the printed circuit board;
   an electrode connecting wire extending from a top portion of the LED chip to outside the bowl-shaped reflective surface, and back through the reflector to the printed circuit board, to which the electrode connecting wire is fixed.

2. An improved light emitting diode display as claimed in claim 1, wherein said reflector comprises a passing hole close to the bowl-shaped reflective surface, said electrode connecting wire passing from the top portion of the LED chip into and through the passing hole to the printed circuit board.

3. An improved light emitting diode display as claimed in claim 1, wherein said reflector contains a plurality of said bowl-shaped reflective surfaces, each surrounding an LED chip.

4. An improved light emitting diode display as claimed in claim 1, wherein said reflector forms a matrix, of bowl-shaped reflective surfaces said electrode connecting wire passing from the top portion of the LED chip through opening in the matrix of bowl-shaped reflective surfaces to the printed circuit board.

* * * * *